United States Patent [19]

Nawata

[11] Patent Number: 4,803,385
[45] Date of Patent: Feb. 7, 1989

[54] PHASE DETECTING CIRCUIT

[75] Inventor: Hizuru Nawata, Tokyo, Japan

[73] Assignee: NEC Corporation, Japan

[21] Appl. No.: 17,625

[22] Filed: Feb. 24, 1987

[30] Foreign Application Priority Data

Feb. 25, 1986 [JP] Japan .................................. 61-39416

[51] Int. Cl.⁴ ...................... H03B 3/64; G01R 25/00; H03K 5/26
[52] U.S. Cl. ................................... 307/516; 328/109; 328/134; 329/112; 307/262
[58] Field of Search ...................... 307/514, 516, 262; 328/109, 133, 134, 55; 329/112

[56] References Cited

U.S. PATENT DOCUMENTS

| | | | |
|---|---|---|---|
| 3,344,353 | 9/1967 | Wilcox | 307/262 |
| 3,548,321 | 12/1970 | Duquesne | 328/133 |
| 3,931,585 | 1/1976 | Barker et al. | 328/134 |
| 4,096,442 | 6/1976 | McRae et al. | 329/112 |

Primary Examiner—Stanley D. Miller
Assistant Examiner—Richard Roseen
Attorney, Agent, or Firm—Ostrolenk, Faber, Gerb & Soffen

[57] ABSTRACT

A phase detecting circuit for detecting a phase differential between a reference clock and a bit timing extracted from a demodulated signal, which is derived from a modulation wave modulated by a digital signal. The circuit successfully eliminates points of discontinuity in the phase detection characteristic of a phase detector and, therefore, accurately determines a phase differential between the bit timing and the reference clock with no regard to the magnitude of the phase differential of an input. An absolute value averaging circuit is provided for averaging the absolute valves of a plurality of consecutive outputs of a phase detector. A sign majority decision circuit is provided for producing one of positive and negative signs of the consecutive outputs of the phase detector which is decided by majority. Further, a multiplier is provided for multiplying an output of the absolute value averaging circuit and an output of the majority decision circuit, the resulting product being delivered as a phase differential.

5 Claims, 6 Drawing Sheets

PHASE DETECTING CIRCUIT

BACKGROUND OF THE INVENTION

The present invention relates to an improvement in a phase detecting circuit and, more particularly, to a phase detecting circuit for detecting a differential in phase between a reference clock and a bit timing which is extracted from an analog signal, which is produced by demodulating a carrier wave modulated by a digital signal, e.g. . phase shift keying (PSK) carrier wave.

A phase detecting circuit of the type described suffers from a drawback that its phase detection characteristic has points of discontinuity which occur at some phase differentials. The discontinuity prevents a true phase differential from being achieved even if those samples which are scattered around that particular phase are averaged.

SUMMARY OF THE INVENTION

It is therefore an object of the present invention to provide a phase detecting circuit which promotes exact estimation of a phase differential between a bit timing and a reference clock by eliminating the points of discontinuity particular to the phase detection characteristic of a phase detector.

It is another object of the present invention to provide a generally improved phase detecting circuit.

A phase detecting circuit for detecting a phase differential between a bit timing and a reference clock of the present invention comprises a phase detector for producing a phase differential between the reference clock and a bit timing which has a same frequency as the reference clock, an absolute value averaging circuit for averaging absolute values of a plurality of consecutive outputs of the phase detector, a sign majority decision circuit for producing one of positive and negative signs of the consecutive outputs of the phase detector which is decided by majority, and a multiplier for multiplying an output of the absolute value averaging circuit and an output of the majority decision circuit, the resulting product being delivered as a phase differential.

The above and other objects, features and advantages of the present invention will become more apparent from the following detailed description taken with the accompanying drawings.

DESCRIPTION OF THE PREFERRED EMBODIMENT

Figure 1:
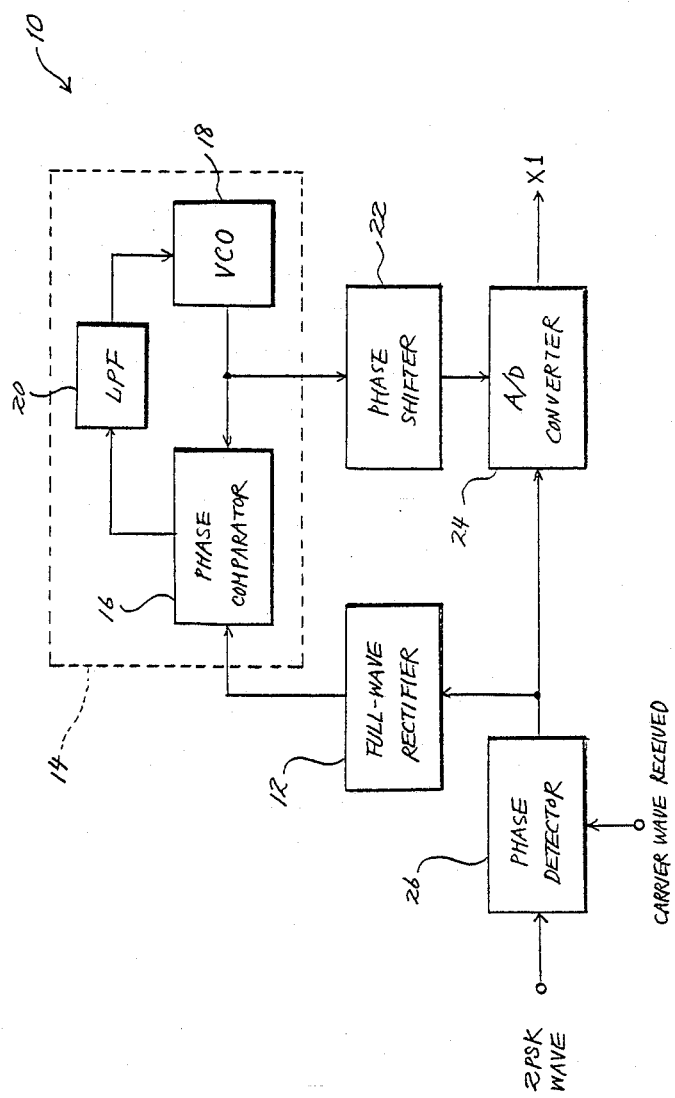
FIG. 1 is a block diagram showing a prior art bit timing recovery circuit.

To better understand the present invention, a prior art bit timing signal recovery circuit will be described with reference to FIG. 1. This circuit comprises a full-wave rectifier 12, a phase lock loop circuit 14 including a phase comparator 16, a voltage controlled oscillator 18 and a low-pass filter 20, a phase shifter 22, and an A/D converter 24. FIG. 1 shows a case wherein the modulation wave is a binary PSK (BPSK) wave. This circuit operates as follows. An inputted PSK signal is demodulated at a phase detector 28 by using a recovered carrier wave to produce a baseband signal. The demodulated baseband signal is supplied to the full-wave rectifier 12 where the frequency of the demodulated baseband signal is doubled to extract a timing signal. The extracted signal is then supplied to the ordinary phase lock loop circuit 14 to obtain a recovered timing signal containing less jitter components, the recovered timing signal being phase synchronized with the extracted timing signal and limited in a narrow bandwidth. The output of the phase lock loop circuit 14 is supplied to the A/D converter 24 via the phase shifter 22 and used as the timing signal for sampling and shaping the demodulated baseband signal. At this time, it is necessary to adjust the phase of the recovered timing signal with the phase shifter 22 so that the demodulated baseband signal would be sampled at an optimum timing. With this circuit, although it is possible to recover a timing signal containing less jitter components, it is necessary to adjust the phase. Further, because all of the phase lock loop circuit 14 made up of the phase comparator 16, voltage controlled oscillator 18 and low-pass filter 20, the full-wave rectifier 12 and the phase shifter 22 are adapted for analog processing, they are not suitable for IC configuration which is essential for software processing by a CPU.

Figure 2:
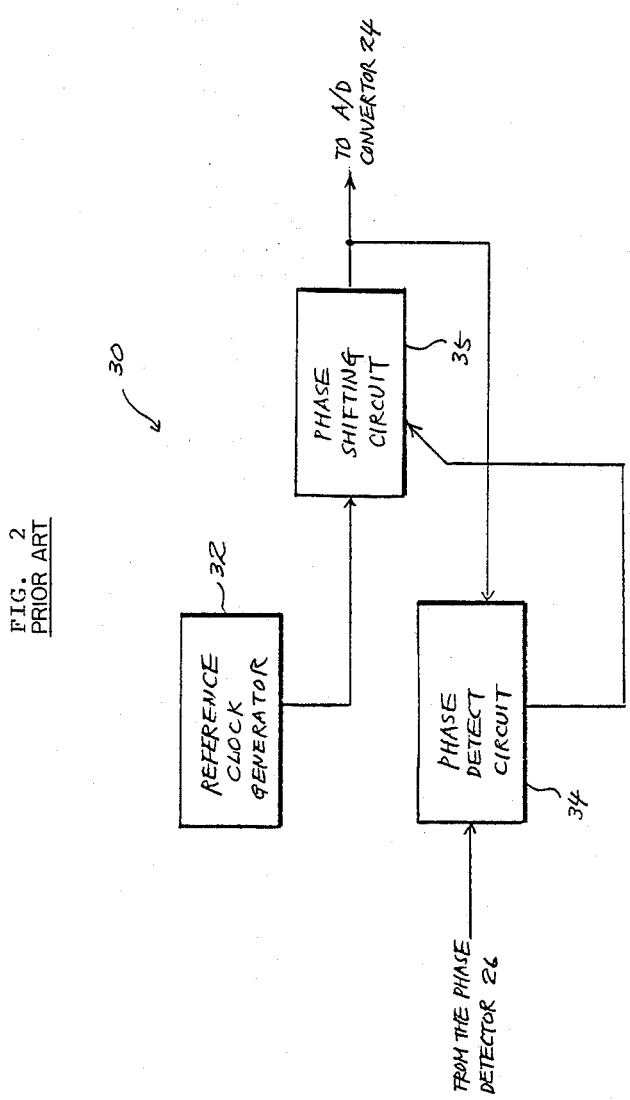
FIG. 2 is a block diagram showing a prior art bit timing recovery circuit.

Referring to FIG. 2, an example of prior art bit timing recovery circuits is shown and generally designated by the reference numeral 30. As shown, the circuit 30 comprises a clock generator 32 for generating a reference clock, a phase detecting circuit 34 supplied with a signal which is outputted by, for example, the phase detector 26 of FIG. 1 and synchronized in phase with the reference clock, and a phase shifting circuit 35 supplied with the reference clock and the output of the circuit 34. The phase shifting circuit 35 produces a clock which is phase-synchronized with a bit timing regenerated, the clock being fed to, for example, the A/D converter 24 of FIG. 1. It is to be noted that the circuit 35 corresponds to the phase shifter 22 of FIG. 1. In this circuitry 30, the phase detecting circuit 34 detects a differential in phase between the reference clock 32 which is built in a demodulator and the bit timing which is extracted from an input signal. The resulting differential is applied to the phase shifting circuit 35 to compensate the phase of the reference clock, whereby a clock which is synchronized with the bit timing is delivered from the phase shifting circuit 35.

It will be understood from the above example that the ability of bit timing recovery in a demodulator is critically affected by whether or not the phase differential between the reference clock and the symbol timing can be detected with accuracy even under a low C/N (carrier power to noise power ratio) operating condition.

Figure 3:
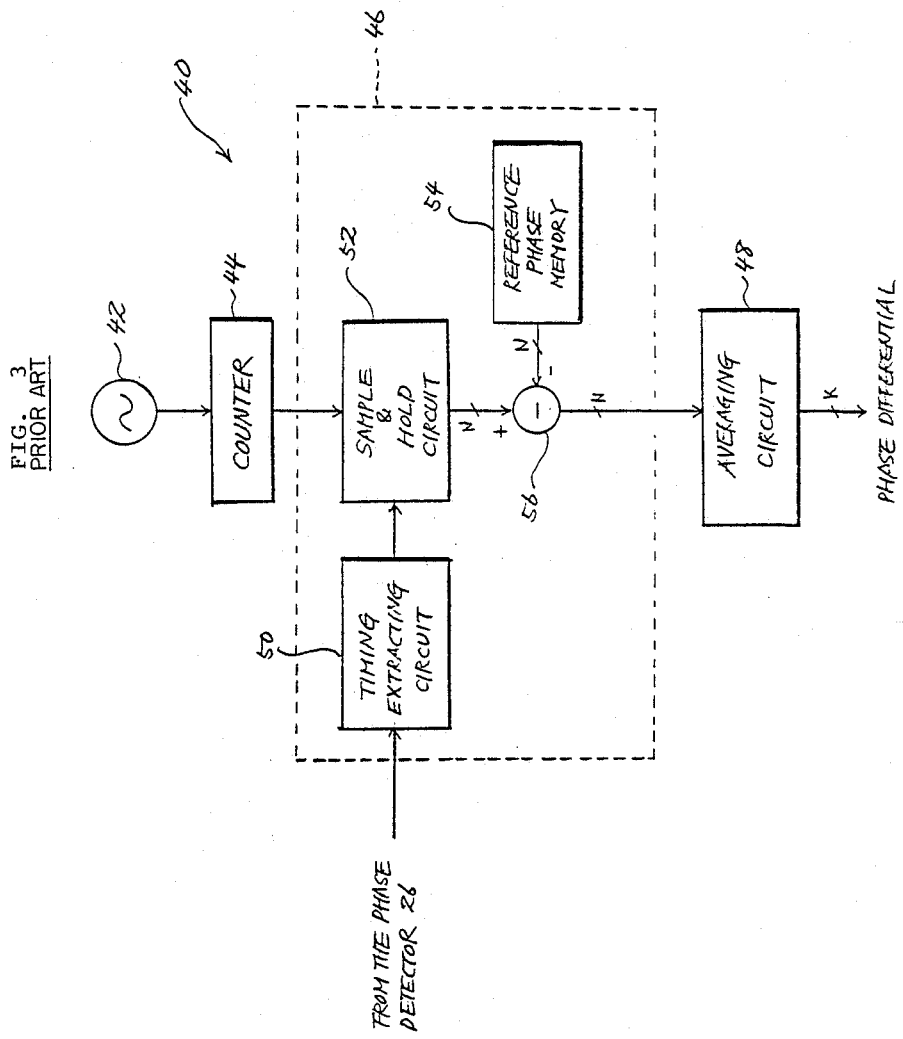
FIG. 3 is a block diagram of a prior art phase detecting circuit.

Referring to FIG. 3, a prior art phase detecting circuit is shown. This circuit, generally 40, is made up of a clock oscillator 42 for generating a stable high-rate clock, a counter 44 for dividing the frequency of the clock, a phase detector 46 for producing the phase differential in response to an analog demodulated signal outputted by, for example, the phase detector 26 of FIG. 1 and an address of the counter 44, and an averaging circuit 48 for averaging the outputs of the phase detecting circuit 46 to produce phase differential. The phase detecting circuit 46 comprises a timing extracting circuit 50 which is shown in FIG. 4, a sample and hold circuit 52 which may be implemented with a flip-flop, a reference phase memory 54 for storing a reference phase, and a subtractor 56.

Figure 4:
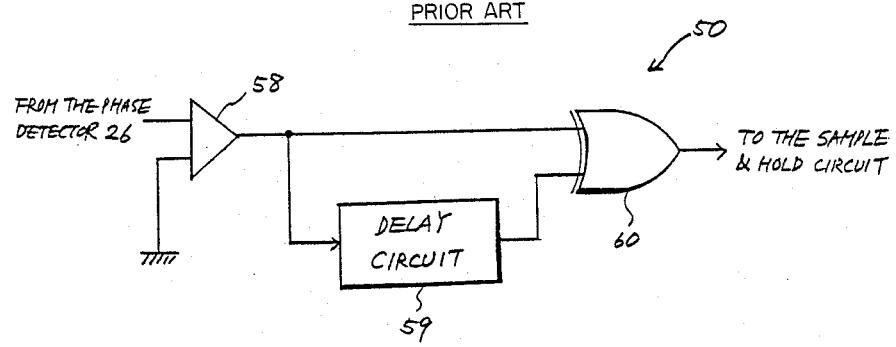
FIG. 4 is a block diagram showing a specific construction of a timing extracting circuit which is included in the circuit of FIG. 3.

As shown in FIG. 4, the timing extracting circuit 50 may be implemented with a comparator 58 for comparing the analog demodulated signal with a reference level which corresponds to the center level of the demodulated signal, a delay circuit 58 for delaying the two-level signal output of the comparator 59, and an Exclusive-OR gate 60 to which the output of the delay circuit 58 and the two-level signal are applied. In this construction, the circuit 50 would detect the positive- and negative-going edges of the input signal.

The phase detecting circuit 40 constructed as described above is operated as follows. The frequency of the high-rate clock oscillated by the clock oscillator 42 is divided by N by the counter 44 which is adapted to cyclically counts up pulses from "0" to "N−1". Assuming that the frequency of the high-rate clock is fo (Hz) and that of the bit rate is Fs (Hz), if N is so selected as to satisfy an equation N=fo / Fs, the counter 44 generates a reference clock and the address of which is representative of the phase of the reference clock. The timing at which the demodulated signal inputted to the timing extracting circuit 50 undergoes a transition from binary ZERO to binary ONE or vice versa is extracted by the circuit 50 and, at the extracted timing, the address of the counter 44 is held by the sample and hold circuit 52. The subtractor 56 produces a differential between a counter address (e.g. N/2) representative of a reference phase, which is to be compared with the transition timing of the input signal, and the counter address held by the sample and hold circuit 52, the differential being the phase differential between the bit timing and the reference clock.

Figure 5:
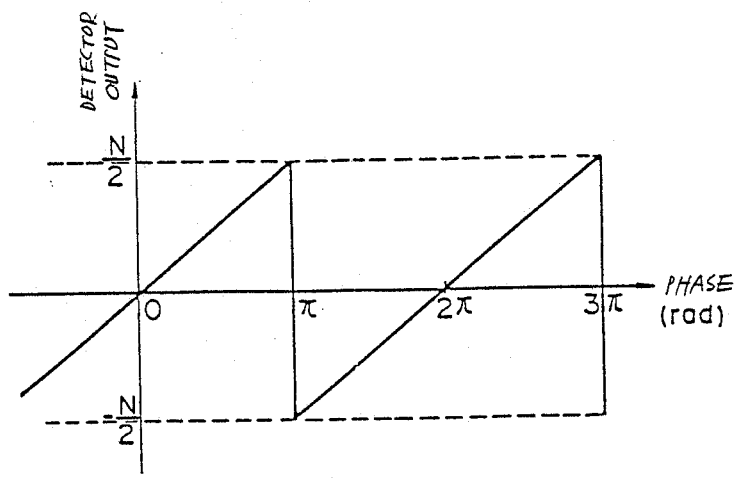
FIG. 5 is a plot representative of a phase detection characteristic of a prior art phase detector.

FIG. 5 shows the phase detection characteristic of the phase detector 46 which is made up of the timing extracting circuit 50, sample and hold circuit 52 and subtractor 56. Because the input demodulated signal previously mentioned contains noise, the outputs of the phase detector 46 are scattered around an expected value. The degree of such scattering increases with the decrease in the C/N ratio, i.e., with the increase in the noise power applied to the input signal. In the light of this, it has been customary to repeat the aforesaid sequence of operations a plurality of times to cause the averaging circuit 48 to average the resulting multiple phase differentials, the output of the circuit 48 being used as an estimated phase differential.

Specifically, as shown in FIG. 5, the phase detector 46 of the prior art phase detecting circuit 40 suffers from the discontinuity in characteristic which occurs when the phase difference is $(2n+1)\pi$ (rad) (n=0, 1, 2, . . .). This brings about a problem that averaging the samples which are scattered around any such particular phase is unsuccessful in providing a true phase differential. Assuming that N/2 and −N/2 were detected by an equal number of times by way of example, then the average would be zero allowing the phase differential to be determined to be zero despite that the true phase differential is $\pi$ (rad). Especially, when it comes to the phase detector 46 operable with a low C/N ratio, the samples would be more scattered around the phase differential in the vicinity of the point discontinuity, pronouncing the above-described problem.

Figure 6:
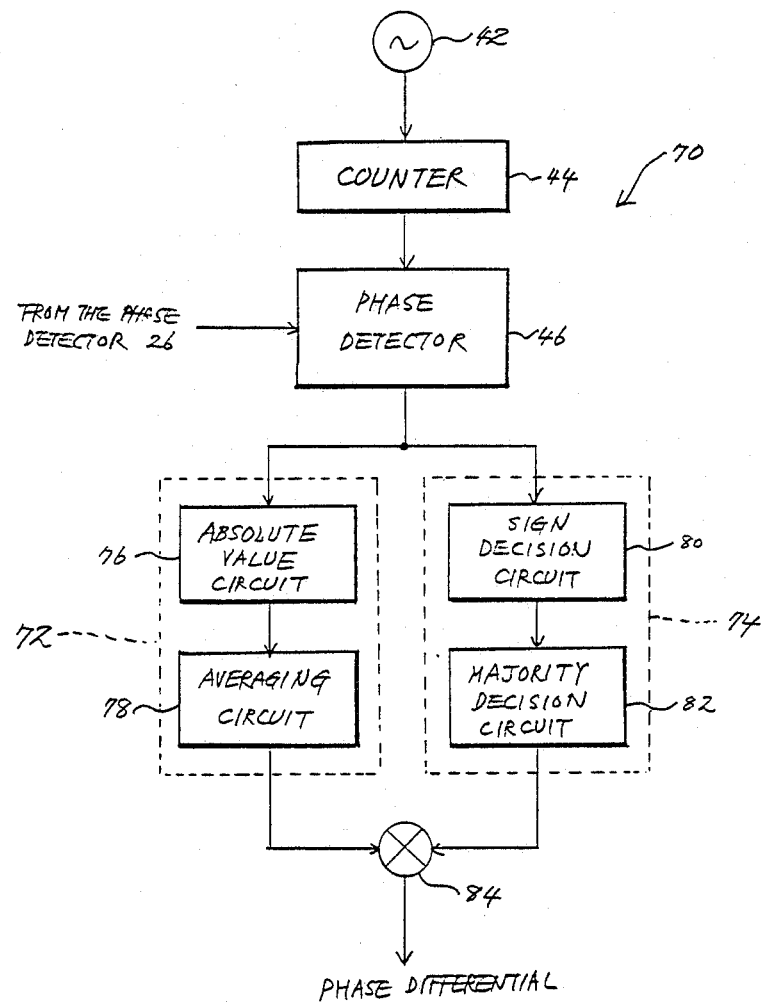
FIG. 6 is a block diagram showing a phase detection circuit embodying the present invention.

Referring to FIG. 6, a phase detecting circuit embodying the present invention is shown and generally designated by the reference numeral 70. In FIG. 6, the same or similar structural elements as those shown in FIG. 3 are designated by like reference numerals. A phase detector 46 as shown in FIG. 6 is the same as the phase detector 46 of FIG. 3 and, therefore, has the phase detection characteristic as stated with reference to FIG. 5. The output of the phase detector 46 is applied to an absolute value averaging circuit 72 and a sign majority decision circuit 74. The absolute value averaging circuit 72 is made up of an absolute value circuit 76 adapted to produce an absolute value of each of a plurality of consecutive outputs of the phase detector 46, and an averaging circuit 78 for averaging the absolute values which are outputted by the circuit 76. The averaging circuit 74 uses the eight-bit 2's complement representation as described in A. V. Oppenheim and R. W. Schafer "Digital Signal Processing", PRENTICE-HALL INC., 1975, i.e., numeral value "1" is represented by a bit stream 0000 0001, "2" by 0000 0010, "−1" by 1111 1111, and −"2" by 1111 1110. Specifically, when the most signifiant bit (MSB) of the number is 1 (ONE), the absolute value of the number may be produced by producing an Ex-OR of the MSB and the other bits and, then, by adding "1" to the Ex-OR; 1111 1111 becomes 0000 0001, and 1111 1110 becomes 0000 0010. When the absolute values provided by the above procedure area added $2^i$ times by an adder and, then, shifted rightward by i bits with ZEROs placed in the upper bits now empty, there will be averaged $2^i$ absolute data.

The sign majority decision circuit 74 comprises a sign decision circuit 80 and a majority decision circuit 82. While the sign decision circuit 80 decides the positive/negative sign of each of the consecutive detector outputs, the majority decision circuit 82 determines by majority decision either one of the signs as decided by the circuit 80 which is greater in number than the other. The sign of binary data can be readily decided based on MSB; in the case of 2's complement representation, the sign is positive if MSB is ZERO and negative when it is ONE. When use is made of an up-down counter which counts up if MSB is ZERO and counts down if it is ONE, the majority by decision can be made on the basis of MSB of the counter. For example, if the number of ZEROs is three and that of ONEs is five, the up-down counter will become "−2", or 1111 1110; the negative signs are greater in number than the positive signs because MSB is ONE.

A multiplier 84 multiplies the avaraged absolute value as produced by the averaging circuit 72 and the sign as produced by the majority decision circuit 74, the product being delivered as a phase differential. Specifically, the majority decision circuit 82 produces 0000 0001 if positive signs are greater in number than the negative signs and 1111 1111 is contrary. Hence, when the output of the averaging circuit 72 is 0000 0010, the product is 0000 0010×0000 0001=0000 0010 under the first-mentioned relation between the signs and 0000

0010×1111 1111=1111 1110 under the second-mentioned relation.

The operation of the phase detecting circuit 70 having the above construction will be described with reference to FIGS. 6 and 7.

First, a modulation wave modulated by a digital signal is demodulated and, then, applied as an analog signal to the phase detector 46 which shares the same characteristic as the prior art one. The detector 46, like the prior art one, produces a phase differential between the reference clock and the bit timing of the demodulated signal entered. As shown in FIG. 5, the output of the detector 46 appears in both of the positive and negative regions, e.g., from N/2 to −N/2 and, in addition, it involves points of discontinuity. Because the demodulated signal applied to the phase detector 46 usually contains noise, as previously mentioned, it is necessary for a plurality of consecutive outputs of the detector 46 to be averaged. However, the drawback particular to the prior art cannot be eliminated by simply averaging the detector outputs, because the phase detection characteristic of the phase detector 46 is the same as the prior art one.

In the light of the above, a plurality of consecutive outputs of the phase detector 46 are applied to the absolute value circuit 76 which then produces the absolute value of each of the detector outputs. The absolute values of the detector outputs are averaged by the averaging circuit 78. In parallel with such operations of the circuits 76 and 78, the positive and negative signs of the outputs of the phase detector 46 are decided by the sign decision circuit 80, whereafter which one of positive and negative signs is greater in number than the other in the outputs of the circuit 80 is determined by the majority decision circuit 82. The circuit 82 outputs "+1" if the positive sign is greater than or equal to the negative sign while outputting "−1" if otherwise.

Figure 7:
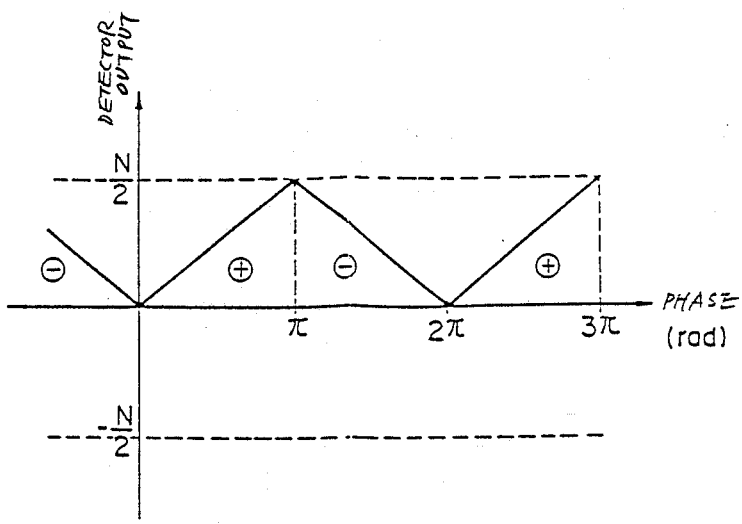
FIG. 7 is a plot showing a phase detection characteristic attainable by applying an output of a phase detector to an absolute value circuit and a bit decision circuit in accordance with the present invention.

Referring to FIG. 7, there is shown a phase detection characteristic attainable with the absolute value circuit 76 and sign decision circuit 80. As shown, the detector outputs appear in the positive region only (because their absolute values are used) so that the characteristic is free from discontinuity. In FIG. 7, "+" and "−" correspond to the outputs of the sign decision circuit 80. In this manner, the points of discontinuity in the phase detection characteristic is eliminated by using the absolute values of outputs of the phase detector 46. Therefore, whichever the phase around which the sample points are scattered may be, the average value of the sample points is representative of a value which is approximate to the true phase differential. Further, the particular positive/negative region in which the phase differential lies can be decided on the basis of the information derived from the majority decision of signs. It follows that a phase approximate to the true phase differential can be estimated by multiplying the average of absolute values produced by the averaging circuit 78 by the output of the majority decision circuit 82. It is to be noted that the number of samples provided by the phase detector 46 may be increased as desired in order to bring the output of the multiplier 84 as close to the true phase differential as possible.

In summary, it will be seen that a phase detecting circuit of the present invention successfully eliminates points of discontinuity in the phase detection characteristic of a phase detector and, therefore, accurately determines a phase differential between the bit timing of an analog demodulated signal and the reference clock with no regard to the magnitude of the phase differential of an input.

Another advantage attainable with the present invention is that the phase detecting circuit is operable with simple calculations and, therefore, can be readily implemented with a digital circuit which is feasible for software processing by a CPU.

Various modifications will become possible for those skilled in the art after receiving the teachings of the present disclosure without departing from the scope thereof.

What is claimed is:

1. A phase detecting circuit for detecting a phase differential between a bit timing and a reference clock, comprising:
   a phase detector for producing a phase differential between said reference clock and an input signal including bit timing which has a same frequency as said reference clock;
   an absolute value averaging circuit for averaging absolute values of a plurality of consecutive outputs of said phase detector;
   a sign majority decision circuit for producing one of positive and negative signs of said consecutive outputs of said phase detector which is decided by majority; and
   a multiplier for multiplying an output of said absolute value averaging circuit and an output of said majority decision circuit, the resulting product being delivered as a phase differential.

2. A phase detecting circuit as claimed in claim 1, wherein said absolute value averaging circuit comprises an absolute value circuit which receives said consecutive outputs of said phase detector and produces absolute values of said consecutive outputs of said phase detector, and an averaging circuit which averages said absolute values and provides output to said multiplier.

3. A phase detecting circuit as claimed in claim 1, wherein said majority decision circuit comprises a sign decision circuit which receives said consecutive outputs from said phase detector and decides and outputs positive and negative signs of said consecutive outputs of said phase detector, and a majority decision circuit which produces one of said positive and negative signs which is greater in number than the other provides output to said multiplier.

4. A phase detecting circuit as claimed in claim 2, wherein said averaging circuit uses eight-bit 2's complement representation.

5. A phase detecting circuit as claimed in claim 3, wherein said majority decision circuit comprises an up-down counter which counts up if the sign determined by said sign decision circuit is positive, and which counts down if the sign determined by said sign decision circuit is negative.

* * * * *